(12) United States Patent
Lung

(10) Patent No.: US 8,605,495 B2
(45) Date of Patent: Dec. 10, 2013

(54) ISOLATION DEVICE FREE MEMORY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 294 days.

(21) Appl. No.: 13/103,887

(22) Filed: May 9, 2011

(65) Prior Publication Data

US 2012/0287706 A1   Nov. 15, 2012

(51) Int. Cl.
*G11C 11/00*   (2006.01)

(52) U.S. Cl.
USPC ............. 365/163; 365/185.19; 365/185.24

(58) Field of Classification Search
USPC ............................ 365/163, 185.19, 185.24
See application file for complete search history.

(56) References Cited

U.S. PATENT DOCUMENTS

| | | | |
|---|---|---|---|
| 5,166,758 A | 11/1992 | Ovshinsky et al. | |
| 5,687,112 A | 11/1997 | Ovshinsky | |
| 5,841,150 A | 11/1998 | Gonzalez et al. | |
| 6,426,891 B1 | 7/2002 | Katori | |
| 6,473,332 B1 | 10/2002 | Ignatiev et al. | |
| 6,521,973 B2 | 2/2003 | Sharples et al. | |
| 6,579,760 B1 | 6/2003 | Lung | |
| 6,800,504 B2 | 10/2004 | Li et al. | |
| 6,888,750 B2 | 5/2005 | Walker et al. | |
| 6,992,369 B2 | 1/2006 | Kostylev et al. | |
| 7,116,593 B2 | 10/2006 | Hanzawa et al. | |
| 7,153,721 B2 | 12/2006 | Campbell | |
| 7,180,767 B2 | 2/2007 | Chen et al. | |
| 7,236,394 B2 | 6/2007 | Chen et al. | |
| 7,365,385 B2 | 4/2008 | Abbott | |
| 7,427,531 B2 | 9/2008 | Cho et al. | |
| 7,499,355 B2 * | 3/2009 | Scheuerlein et al. | 365/201 |
| 7,551,473 B2 | 6/2009 | Lung et al. | |
| 7,623,370 B2 | 11/2009 | Toda et al. | |
| 7,646,630 B2 * | 1/2010 | Lowrey et al. | 365/163 |
| 7,651,906 B2 | 1/2010 | Park et al. | |
| 7,893,419 B2 | 2/2011 | Hudgens et al. | |
| 7,916,574 B1 * | 3/2011 | Solomon et al. | 365/230.06 |

(Continued)

OTHER PUBLICATIONS

Tanaka H. et al., "Bit Cost Scalable Technology with Punch and Plug Process for Ultra High Density Flash Memory," 2007 Synposium on VLSI Technology Digest of Tech. Papers, pp. 14-15.

(Continued)

*Primary Examiner* — Son Dinh
*Assistant Examiner* — Nam Nguyen
(74) *Attorney, Agent, or Firm* — Haynes Beffel & Wolfeld LLP

(57) ABSTRACT

An integrated circuit memory is based on isolation device free memory cells. The memory cells are passively coupled to bit lines and word lines. The memory cells include an anti-fuse element and an element of phase change material in series. A rupture filament through the anti-fuse layer acts as an electrode for the phase change element. Control circuitry is configured to apply bias arrangements for operation of the memory cells, including a first write bias arrangement to induce a volume of the higher resistivity phase in the phase change material establishing a first threshold for the selected memory cell below a read threshold, a second write bias arrangement to induce a larger volume of the higher resistivity phase in phase change material establishing a second threshold for the selected memory cell above the read threshold, and a read bias arrangement to apply the read threshold to the selected memory cell.

15 Claims, 10 Drawing Sheets

(56) References Cited

U.S. PATENT DOCUMENTS

| | | |
|---|---|---|
| 2003/0211732 A1 | 11/2003 | Chiang |
| 2004/0257848 A1 | 12/2004 | Chen et al. |
| 2005/0029587 A1 | 2/2005 | Harshfield |
| 2005/0270832 A1 | 12/2005 | Chu et al. |
| 2006/0172067 A1 | 8/2006 | Ovshinsky et al. |
| 2006/0186483 A1 | 8/2006 | Cho et al. |
| 2006/0273298 A1 | 12/2006 | Petti |
| 2007/0200202 A1 | 8/2007 | Nowak et al. |
| 2008/0144355 A1 | 6/2008 | Boeve et al. |
| 2008/0211539 A1 | 9/2008 | Parkinson |
| 2008/0280401 A1 | 11/2008 | Burr et al. |
| 2009/0166600 A1 | 7/2009 | Park et al. |
| 2010/0270593 A1 | 10/2010 | Lung et al. |

OTHER PUBLICATIONS

Chen, Y-C. et al., "An Access-Transistor-Free (0T/1R) Non-Volatile Resistance Random Access Memory (RRAM) Using a Novel Threshold Switching, Self-Rectifying Chalcogenide Device," pp. 37.4.1-37.4.4.

Lai S., "Current status of the phase change memory and its future," IEEE Electron Devices Meeting, 2003, IEDM '03 Tech. Digest, pp. 10.1.1-10.1.4.

Kau DC, et al., "A stackable cross point phase change memory," 2009 International Electron Devices Meeting, Baltimore MD, pp. 27.1.1-27.1.4.

Sasago Y., et al., "Cross-point phase change memory with 4F2 cell size driven by low-contact-resistivity poly-Si diode," 2009 Symposium on VLSI Technology Digest of Tech. Papers, pp. 24-25.

Li F., et al., "Evaluation of SiO2 Antifuse ina 3D-OTP Memory," IEEE Transaction on Device and Materials Reliability, vol. 4, No. 3, 2004, pp. 416-421.

Yamada N., "Potential of Ge-Sb-Te Phase-Change Optical Disks for High-Data-Rate Recording," SPIE vol. 3109 (1997) pp. 28-37.

Lee, et al., Highly Scalable Phase Change Memory with CVD GeSbTe for Sub 50nm Generation, 2007 Symposium on VLSI Technology Digest of Technical Papers, pp. 102-103.

\* cited by examiner

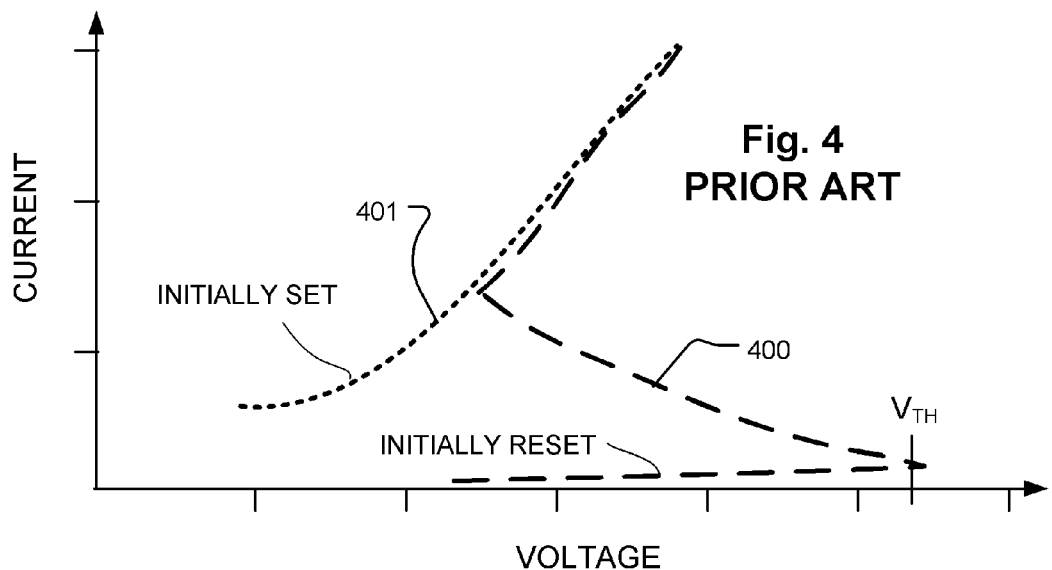
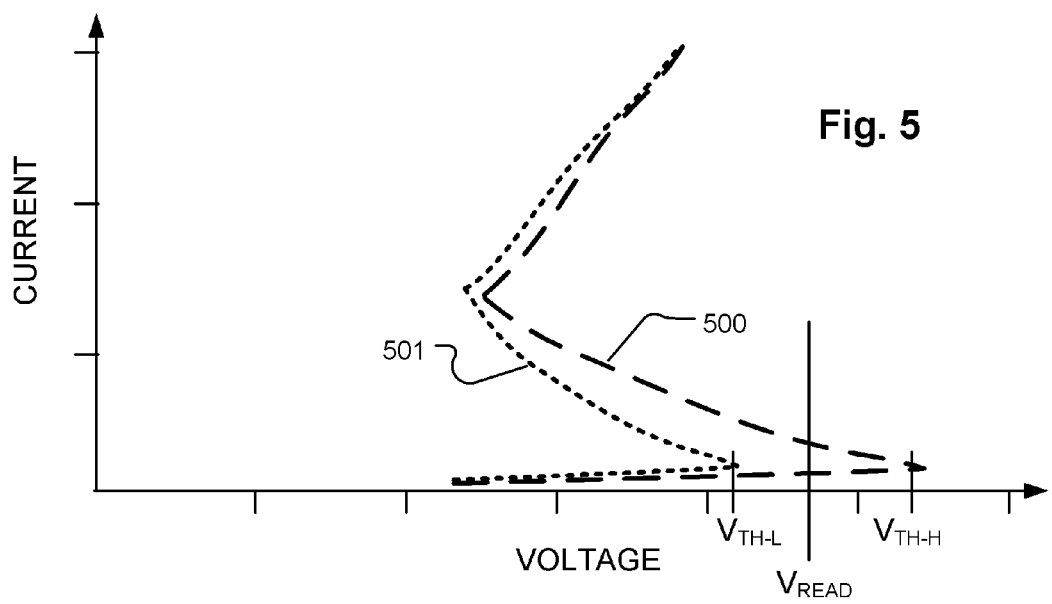

ISOLATION DEVICE FREE MEMORY

BACKGROUND

1. Field of the Invention

This technology relates to integrated circuit memory technologies, including technologies using phase change materials.

2. Description of Related Art

Many three dimensional (3D) memory concepts have been proposed in order to make high density memory. Li et al., "Evaluation of SiO2 Antifuse in a 3D-OTP Memory," IEEE TRANSACTIONS ON DEVICE AND MATERIALS RELIABILITY, VOL. 4, NO. 3, SEPTEMBER 2004, describes a polysilicon diode and an anti-fuse arranged as a memory cell. Sasago et al., "Cross-point phase change memory with 4F2 cell size driven by low-contact-resistivity poly-Si diode," 2009 Symposium on VLSI Technology Digest of Technical Papers, pages 24-25, describes a polysilicon diode and a phase change element arranged as a memory cell. Kau et al., "A stackable cross point phase change memory," IEDM09-617, (2009) pages 27.1.1 to 27.1.4, describes a memory cell including an ovonic threshold switch OTS as an isolation device with a phase change element. These technologies rely on a combination of an isolation device and a memory element to construct the memory cell. The isolation device adds extra processes and thickness and/or area to the memory structure. Also, the isolation device/memory element approach is not suitable for many 3D memory structures, including so called Bit Cost Scalable BiCS structures and other 3D memory structures that include a large number of memory layers.

In Chen et al., "An Access-Transistor-Free (0T/1R) Non-Volatile Resistance Random Access Memory (RRAM) Using a Novel Threshold Switching, Self-Rectifying Chalcogenide Device," IEDM 03-905, (2003), pages 37.4.1 to 37.4.4, a so-called zero transistor/one resistor 0T/1R memory cell is described using a phase change element that does not include a separate isolation device. (See, also, U.S. Pat. No. 7,236,394). But 0T/1R memory cell described in Chen et al. can only be used in small arrays, because after completing the manufacture of the device, the phase change element is in the low resistance crystalline phase. This low resistance phase makes the first programming step for the array difficult, due to the inability to fully isolate unselected cells during the first programming cycle. Also, the 0T/1R cell technology described by Chen et al. includes a relatively large contact area between the electrodes and the phase change element, so that the reset current must be relatively high. Furthermore, because of large leakage current from unselected cells, the size of the array must be very limited in order to preserve the read margins. Thus, the Chen et al. 0T/1R cell has not been successfully deployed for high density memory.

Therefore, it is desirable to provide a memory technology that is suitable for high density structures, and is easily manufactured.

SUMMARY

An integrated circuit is described based on isolation device free, phase change memory cells. The integrated circuit includes a plurality of bit lines and a plurality of word lines. An array of memory cells is passively coupled to the plurality of bit lines and the plurality of word lines, without separate isolation devices. The memory cells in the array include an anti-fuse element and an element of phase change material in series. Sense circuitry is coupled to the array of memory cells to sense whether a selected memory cell has a threshold below a read threshold.

Control circuitry is described that can be coupled to the plurality of bit lines and the plurality word lines to apply bias arrangements for operation of the device. The bias arrangements include a first write bias arrangement to establish a first threshold in a selected memory cell, the first threshold being below the read threshold, by inducing formation of a volume of the higher resistivity phase (e.g. an amorphous phase) of the phase change material, and a second write bias arrangement to establish a second threshold above the read threshold, by inducing a volume of the higher resistivity phase of the phase change material in the selected memory cell. A read bias arrangement is also applied under control of the control circuitry, to apply a read threshold to a selected memory cell, to sense the data value in coordination with the sense circuitry.

The array of memory cells can be initialized by forming rupture filaments through the antifuse elements. The initializing can be performed by applying an initialize bias arrangement for rupturing anti-fuse elements in the array of memory cells, to form the rupture filaments. The rupture filaments are formed during manufacture or during an initial programming of the memory array, under control of on-chip control circuitry, under control of external equipment, or under control of external equipment in combination with on-chip control circuitry.

In some embodiments, the rupture filament can be formed using first and second write bias arrangements like those mentioned above, which are also used in operation of the memory. In embodiments like this, the write bias arrangements as applied to the selected cells exceed the breakdown voltage for the antifuse, while unselected cells are exposed only to voltages that are below the breakdown voltages.

A memory cell described herein includes a layer of anti-fuse material having first and second surfaces, wherein the first surface is proximal to or in contact with a first access conductor, such as a word line. Also, the memory cell includes a layer of phase change material having first and second surfaces. The first surface of the layer of phase change material is in contact with the second surface of the layer of anti-fuse material. The second surface of the layer of phase change material is passively coupled to a second access conductor, such as a bit line. An electrode comprising a rupture filament through the layer of anti-fuse material is passively coupled to a first access conductor, such as a word line, and contacts the layer of phase change material.

In some embodiments, the array of memory cells is configured in the three-dimensional structure providing multiple levels of memory cells, for very high density memory.

A method for operating a memory device based on isolation device free phase change memory cells is also described herein. For example, an operating method can include the following:

initializing the memory cell by rupturing the anti-fuse element;

writing a first data value in the memory cell by applying a first write bias arrangement to induce a volume of the higher resistivity phase in an active region of the element of phase change material, thereby establishing a first threshold for the selected memory cell below a read threshold, writing a second data value in the memory cell by applying a second write bias arrangement to induce a volume of the higher resistivity phase in the active region of the element of phase change material, thereby establishing a second threshold for the selected memory cell above the read threshold; and reading data in the memory cell by sensing whether the selected memory cell has a threshold below the read threshold.

The memory cells as described herein can also be operated according to a method including a step for writing the first data value in a selected memory cell, including a cell which had been previously programmed and had the second threshold, by applying a first bias arrangement to reduce the threshold of the selected cell, followed by a second bias arrangement to establish the first threshold. The first bias arrangement can be a set pulse, with a slow quenching tail, which alters the volume in the active region of the higher resistivity phase to the lower resistivity phase (e.g. a crystalline phase) of the phase change material; and the second bias arrangement can be a reset pulse adapted to induce a volume of the higher resistivity phase in the active region of the element of phase change material to establish the first threshold.

Other aspects and advantages of the technology described herein can be understood with reference to the figures, the detailed description and the claims set out below.

BRIEF DESCRIPTION OF THE DRAWINGS

FIG. 4 is a graph of current versus voltage for a typical phase change memory cell operating with set and reset states.

FIG. 5 is a graph of the current versus voltage for an isolation device free phase change memory cell having data values represented by first and second threshold voltages, as described herein.

DETAILED DESCRIPTION

Detailed descriptions of embodiments of isolation device free phase change memory devices and of methods of operating such devices are provided with reference to FIGS. 1-13.

Figure 1:
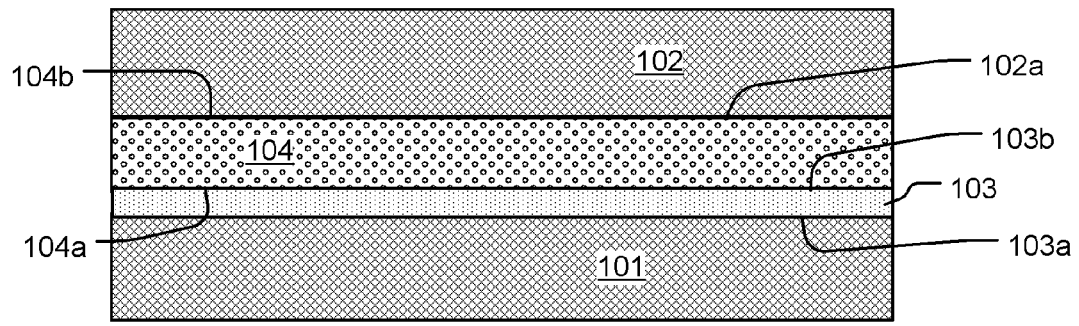
FIG. 1 shows a simplified cross-section of an isolation device free phase change memory cell, prior to initialization.
Figure 2:
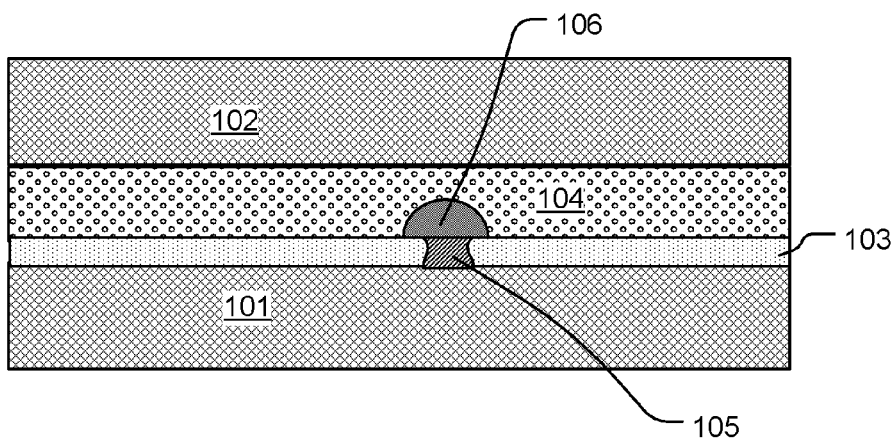
FIG. 2 shows a simplified cross section of the memory cell of FIG. 1, after initialization and programming of a first data value.
Figure 3:
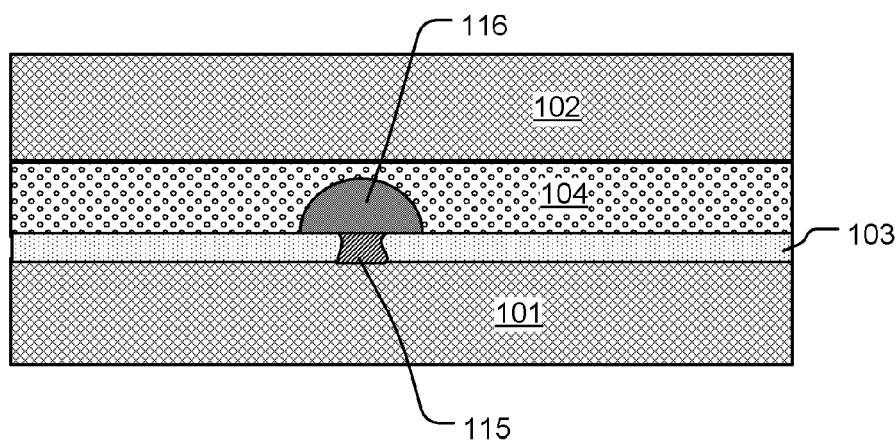
FIG. 3 shows a simplified cross-section of the memory cell of FIG. 1, after initialization and programming of a second of data value.

A basic structure of an isolation device free phase change memory cell is shown in FIGS. 1-3, where FIG. 1 illustrates the device in a state before initialization, FIG. 2 illustrates the device programmed to store a first data value, and FIG. 3 illustrates the device programmed to store a second data value.

Referring to FIG. 1, the device includes a first conductive terminal 101 and a second conductive terminal 102. A layer 103 of anti-fuse material has a first surface 103a in contact with the first conductive terminal 101, and a second surface 103b opposite the first. A layer 104 of phase change material has a first surface 104a in contact with the second surface 103b of the layer 103 of anti-fuse material, and a second surface 104b opposite the first. The second surface of the layer 104 of phase change material is in contact with a surface 102a the second conductive terminal 102.

The first and second conductive terminals 101, 102 can comprise respective portions of access conductors like bit lines or word lines, or can comprise layers of conductive material that are otherwise passively coupled to such access conductors. As used herein, a first element is "passively coupled" to a second element, when there is an electric current flow communication between the first and second element without an intervening rectifying or switching device such as a transistor, a diode or and ovonic threshold switch. According to this use of terminology, the layer 103 of anti-fuse material is passively coupled to the first conductive terminal 101, and the layer 104 of phase change material is passively coupled to the second conductive terminal 102.

The materials chosen for the first and second conductive terminals 101 and 102 can comprise a variety of metals, metal-like materials and doped semiconductors in representative embodiments. Thus, the conductive terminals 101, 102 can be implemented using one or more layers of materials like tungsten, aluminum, copper, titanium nitride, tantalum nitride, tungsten nitride, doped polysilicon, and other materials. For example, the thicknesses of these optional conductive terminals 101, 102 can range from 10 to 100 nm in a representative system. In other embodiments, the conductive terminals 101, 102 are very thin, or much thicker. The material selected for a first conductive terminal 101 is preferably selected for compatibility with the layer 103 of anti-fuse material. Likewise, the material selected for the second conductive terminal 102 is preferably selected for compatibility with the layer 104 of phase change material. The conductive materials can be formed on an integrated circuit using a variety of known techniques, including chemical vapor deposition, physical vapor deposition or sputtering, atomic layer deposition and so on.

Layer 103 of anti-fuse material can be implemented using one or more layers of dielectric such as silicon dioxide, silicon nitride, aluminum oxide, or other anti-fuse materials known in the art. In a representative embodiment, the layer 103 of anti-fuse material comprises a layer of silicon dioxide having a thickness of about 5 to 10 nm. The anti-fuse materials can be formed on an integrated circuit using a variety of known techniques, including thermal oxidation processes, chemical vapor deposition, physical vapor deposition or sputtering, atomic layer deposition and so on.

Layer 104 of phase change material can be implemented using one or more layers of phase change materials. For example, the phase change material can comprise $Ge_2Sb_2Te_5$, in a pure stoichiometric form or in a form including additives or dopants, having a thickness of 10 to 50 nm for example.

Embodiments of phase change materials include chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with, or include additives of, impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Pat. No. 7,893,419.

Phase change materials are capable of being switched between a first structural state in which the material is in a generally high resistivity, amorphous solid phase, and a second structural state in which the material is in a generally low resistivity, crystalline or polycrystalline solid phase in its local order in the active channel region of the cell. These materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103. A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes. Additives can be included in the phase change material by co-sputtering, or by other methods.

After the formation and patterning of memory devices using the structure shown in FIG. 1, and performing back-end-of-line processing to complete an integrated circuit, the layer 104 of phase change material will typically have been exposed to thermal cycling that induces a transition to, or preserves, a low resistivity, crystalline phase in the layer 104 of phase change material. The layer 103 of anti-fuse material will block current flow between the first and second conductive terminals 101, 102 before initialization of the memory cell.

Referring to FIG. 2, a memory cell having the structure shown in FIG. 1 is initialized by rupturing the anti-fuse element formed by the layer 103 of anti-fuse material. For an embodiment in which the layer 103 of anti-fuse material comprises a thin film of silicon dioxide, on the order of 5 to 10 nm thick, the voltage on the order of 5 V can be applied across the first and second conductive terminals 101, 102 to cause takedown of the silicon dioxide and formation of a conductive path, referred to herein as a rupture filament 105, which extends through the layer 103 of anti-fuse material. The rupture filament 105 acts as an electrode in contact with the layer 104 of phase change material, and passively coupled to the first conductive terminal 101. The area of the contact between the rupture filament 105 and the layer 104 of phase change material can be substantially less than the surface area of the layer 104 of phase change material in contact with the layer 103 of anti-fuse material. As a result of the use of the rupture filament 105 as the electrode, current flow is concentrated at the contact interface with the layer 104 of phase change material.

Upon formation of the rupture filament 105, data is written by inducing formation of a volume (e.g. 106) of the high resistivity, amorphous phase within the layer 104 of phase change material. For a first data value (say logic 0), the volume 106 has a first size which is large enough to prevent direct connection between the rupture filament 105 and crystalline phase material in the layer 104.

Referring to FIG. 3, in another memory cell, the rupture filament 115 can be formed in a different location in the structure. Also, in order to program a second data value (say logic 1), a volume 116 of the high resistivity, amorphous phase, which is larger than the volume 106, or which is otherwise modified so at to result in a higher resistance in the current path through the material, is formed in the active region at the interface between the rupture filament 115 and the layer 104.

Both the first data value and the second data value are represented by the formation of volumes 106, 116 of amorphous phase material having high resistivity. Therefore, both data values are represented by high resistance structures that block current flow so long as the device is operated below the threshold.

FIG. 4 is a current versus voltage (I-V) graph showing performance for the typical prior art set and reset states for phase change memory material. In a memory cell which is initially in a set state, having a low resistivity crystalline phase in the active region, the I-V graph shows a relatively linear response with a substantial slope, as represented by trace 401. For a memory cell initially in the reset state, having a high resistivity amorphous phase in the active region, the I-V graph shows a very small slope on trace 400, until a threshold voltage $V_{TH}$ is reached. When the threshold voltage $V_{TH}$ is reached, there is a region of negative resistance or snap-back region, where the active region of the phase change material melts or begins to melt. Eventually, the trace 400 approaches the line in trace 401, and then follows it. During a read operation of a prior art phase change memory cell, it is sufficient to detect the difference between the resistance of the reset state cell and the set state cell operating well below the threshold voltage $V_{TH}$.

FIG. 5 is an I-V graph showing performance of a memory cell like that of FIGS. 2 and 3. The trace 501 represents the performance of a memory cell like that of FIG. 2 which reaches snap-back at a relatively lower threshold $V_{TH-L}$. Trace 500 represents the performance of a memory cell like that of FIG. 3, which reaches snap-back at a relatively higher threshold $V_{TH-H}$. A read threshold $V_{READ}$ is specified for operation of memory devices as described herein, which is between the relatively lower threshold $V_{TH-L}$ and the relatively higher threshold $V_{TH-H}$. A data value can be sensed by determining whether the memory cell reaches the snap back condition and for example conducts significant current in response to the read threshold $V_{READ}$, or remains in the high resistivity phase.

It will be appreciated that memory cells can be implemented as described herein, where there are more than two data values (i.e. more than one bit) stored per cell, by establishing write protocols and read protocols that cause threshold voltages in more than two ranges.

Figure 6A:
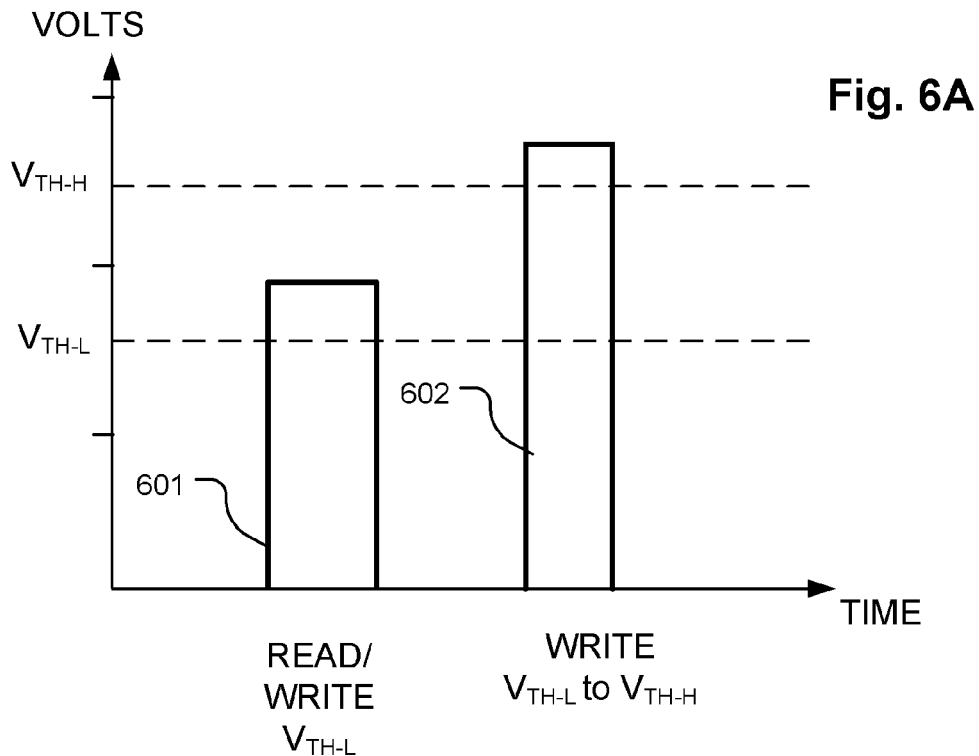
FIG. 6A illustrates a representative program pulse for a transition from low threshold to high threshold, and a combined program/read pulse which can be used in operation of a memory cell as shown in FIGS. 1-3.
Figure 6B:
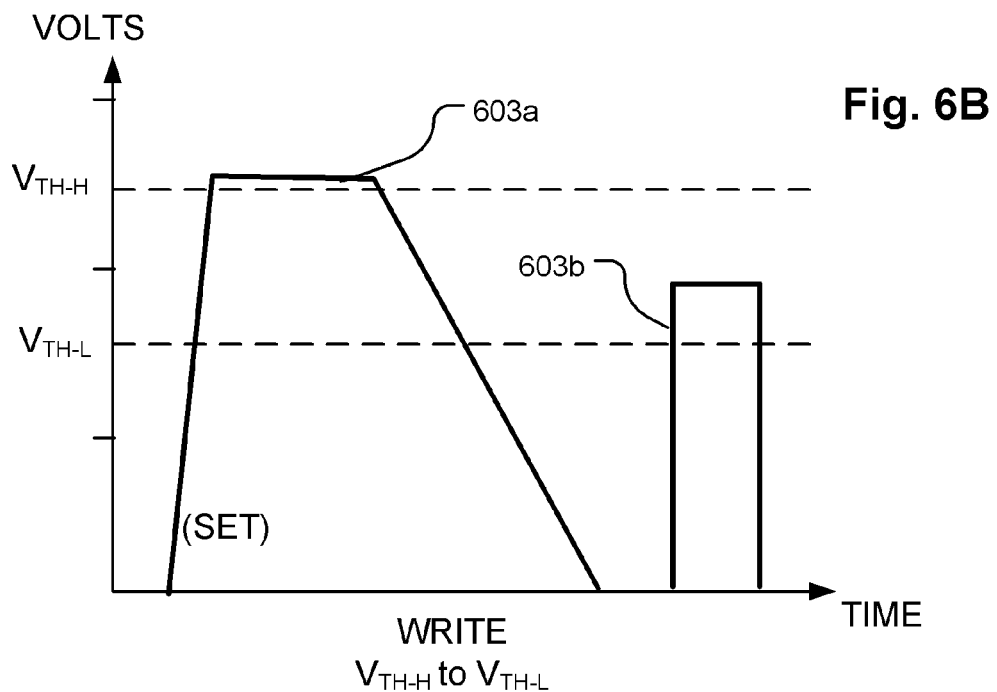
FIG. 6B illustrates a representative program pulse sequence for a transition from high threshold to low threshold which can be used in operation of a memory cell as shown in FIGS. 1-3.

FIGS. 6A and 6B illustrates bias arrangements which can be used in operation of a memory cell like that of FIGS. 1-3. As shown in FIG. 6A, the first pulse 601 can be used for both the read operation, and for programming the low threshold $V_{TH-L}$ state. Thus in operation, a read bias arrangement and a first write bias arrangement can be identical, where the term "identical" in this context means that the circuitry used to drive the bias arrangements are driven in the same manner. The first pulse 601 is characterized by a peak amplitude between the low threshold $V_{TH-L}$ and the high threshold $V_{TH-H}$. Also, the pulse 601 has a pulse shape, including pulse width and the slope of the trailing edge, results during a read operation in reestablishing the low threshold state in the memory cell. A second pulse 602 can be used for programming the high threshold $V_{TH-H}$ state, on a transition from a low threshold state or other lower resistance condition. The second pulse 602 has a pulse height greater than the high threshold state and a trailing edge arranged to quench the phase transition in the amorphous state to establish the high threshold $V_{TH-H}$ state in the memory cell.

FIG. 6B shows a pulse sequence for a write operation requiring transition from a high threshold $V_{TH-H}$ state to a low threshold $V_{TH-L}$ state. The sequence includes a set pulse 603a which causes the active region to heat up beyond a crystallization temperature, lowering resistance of the cell, followed by a reset pulse 603b. A set pulse can have a shape like pulse 603a, with an amplitude which can exceed the snap-back threshold $V_{TH-H}$ in some embodiments, and where the trailing edge is relatively slow so that the phase change material settles in the crystalline phase in the active region of the cell. After lowering the resistance of the selected cell by applying a set pulse, or by other biasing arrangments, the pulse 603b can be applied to establish the low threshold $V_{TH-L}$ state. Also, the pulse 603b can have a pulse shape, including pulse height above the low threshold $V_{TH-L}$, pulse width and the slope of the trailing edge, resulting in establishment of the low threshold state in the memory cell. The pulse 603b may be identical to the read pulse 601 in some embodiments.

Both the first pulse 601, the second pulse 602, and the pulse 603b can be characterized as "reset" bias arrangements, because they induce a volume of the high resistivity amorphous phase of the phase change material in the active region of the cell, normally associated with a "reset" state in such devices. As a result of using reset bias arrangements to program the memory cells for all of the data values to be stored, all of the memory cells in the array present high resistance to current flow unless the voltage exceeding the snap-back threshold of the lowest threshold state is applied to the cell. Because of this high resistance, the need for an isolation device is eliminated when operated appropriately.

The first pulse 601 (or the pulse 603b) and the second pulse 602 can be applied to a cell in the initial state as illustrated in FIG. 1, as the pulses can have peak amplitudes that exceed the breakdown voltage for the anti-fuse element. In an alternative embodiment, for an initializing cycle, initialize-program pulses can be adapted to pulse shapes that are most efficient for a particular implementation of the technology. For example, the write pulses used during the initial programming of the memory can include a short, high voltage peak followed by the pulse shape needed to achieve the desired threshold value. Accordingly, a memory array including a large number of cells can be programmed without suffering high leakage current problems of the prior art 0T/1R cell described in Chen et al.

Figure 7:
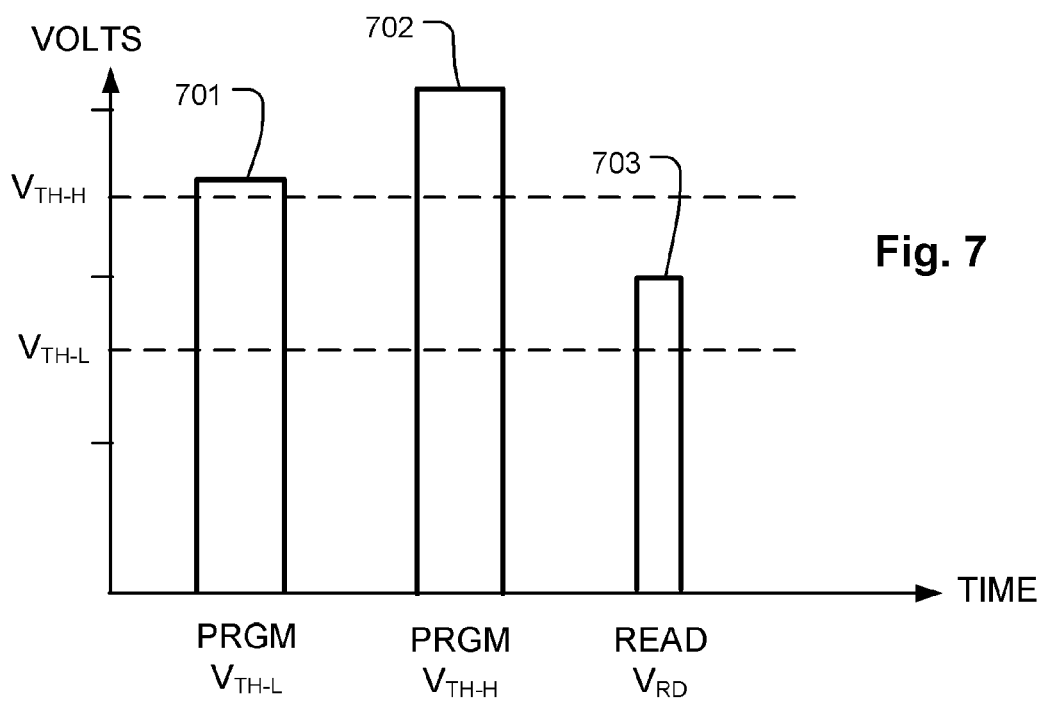
FIG. 7 illustrates an alternative set of program pulses and a read pulse which can be used in operation of a memory cell as shown in FIGS. 1-3.

FIG. 7 illustrates an alternative set of pulses that can be used in operation of a memory cell like that of FIGS. 1-3. The set of pulses in FIG. 7 includes a first program pulse 701 configured to establish the low threshold $V_{TH-L}$ state, a second program pulse 702 configured to establish the high threshold $V_{TH-H}$ state, and a read pulse 703 configured especially for a read operation. The read pulse 703 is characterized by a relatively narrow pulse width to minimize read disturb problems.

Figure 8A:
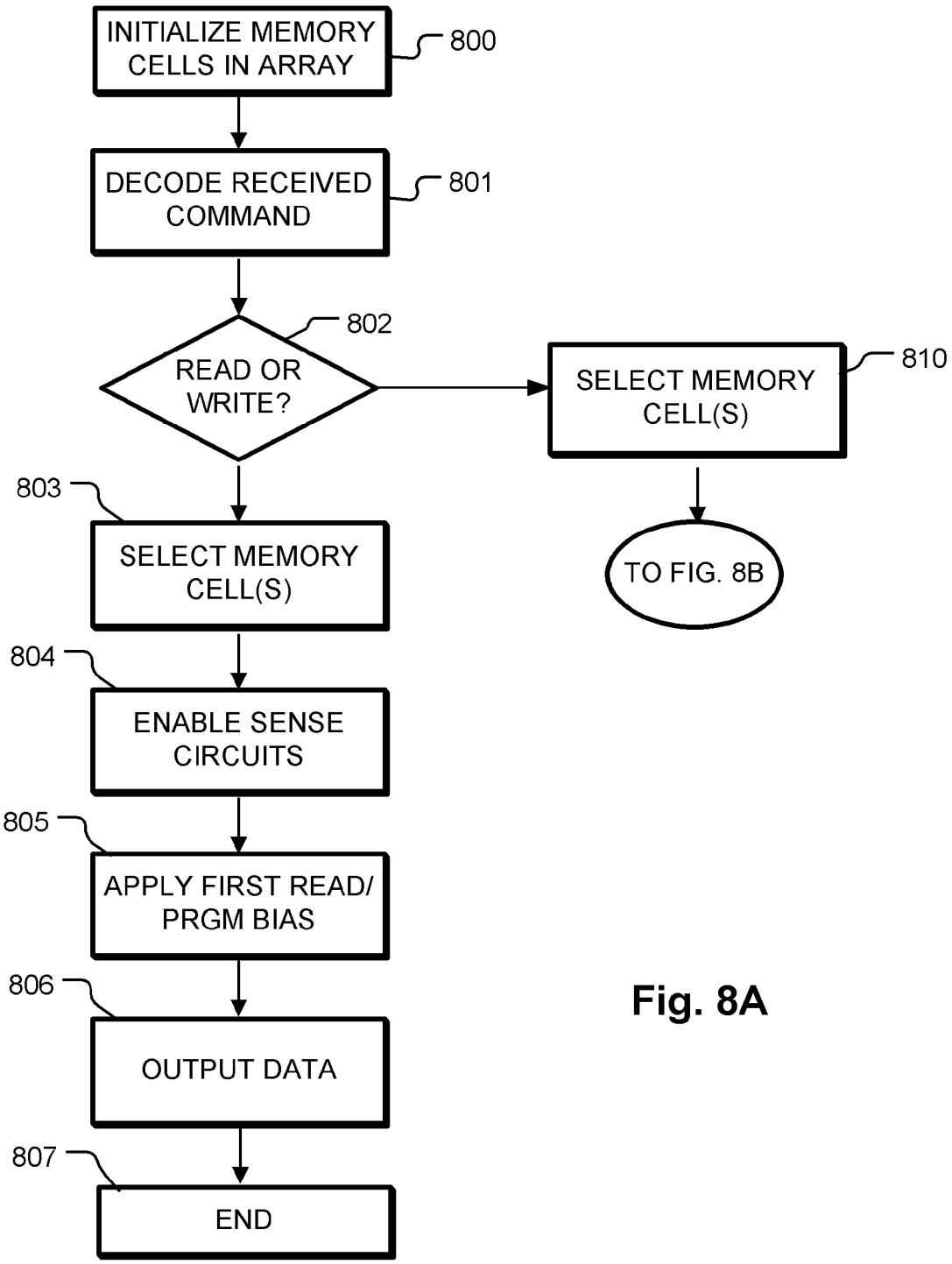
FIG. 8 is a flowchart showing a method of operation for a memory device as described herein.
Figure 8B:
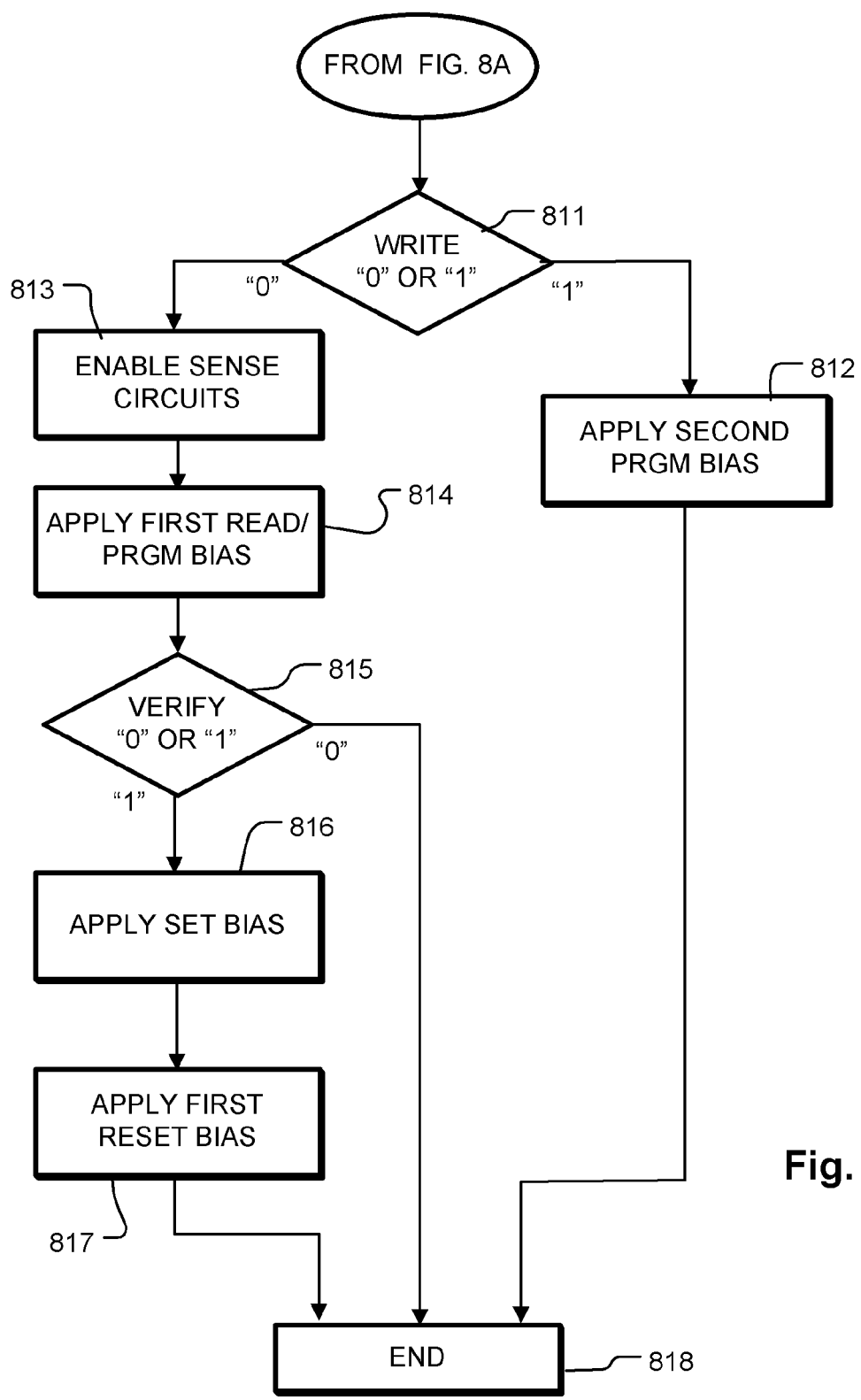

FIGS. 8A and 8B provide a flowchart illustrating an operating method for an integrated circuit memory device including an array of memory cells like that of FIGS. 1-3. Referring to FIG. 8A, in a first step 800, the memory cells in the array are initialized by storing an initial data set therein. The initial data set can comprise pre-specified information, such as a microcode, computer program, image files, data files and so on, or can comprise a pre-specified pattern of data, such as all zeros, all ones, alternating ones and zeros in a checkerboard pattern and so on. Initializing step 800 can be executed using machine at the factory, during a manufacturing process. For example, the test system in a manufacturing line can be configured to initialize the memory cells by exercising control circuitry on the integrated circuit, or using integrated circuit probes or other connections, to apply programming signals under external control. Alternatively, initializing step 800 can be executed using control circuitry on the integrated circuit as discussed below.

After initializing the memory cells, the integrated circuit can wait for a read or write command (801). When a command is received, the process determines whether it is a read or a write command (802). If it is a read command, addresses are decoded and the memory cells to be read are selected (803). The sense circuits to be used in the read operation are enabled (804). In coordination with the sense circuits, the first read/write bias arrangement, including the first read and program pulse as described above with reference to FIG. 6A are applied to the selected memory cell or cells (805), along with suitable inhibit voltages applied to unselected cells that prevent disturbance of their data. Next, the data is output by the sense circuits (806), and the read operation is ended (807). If a command at step 802 is a write command, then the addresses are decoded and the memory cells to be written are selected (810), and the process continues as shown in FIG. 8B.

In the first step shown in FIG. 8B, it is determined whether the data value to be written is a first data value such as "0" or a second data value such as "1" (811). In alternative embodiments, as mentioned above, the data value can take on more than one bit per cell, and the step 811 will be adapted accordingly. If the data value to be written is a "0", then the sense amplifiers are enabled (813) and the first read/write bias arrangement is applied (814), along with suitable inhibit voltages applied to unselected cells that prevent disturbance of their data. The data sensed at the sense amplifiers is compared with the intended "0" value to determine whether the read/write bias was successful (815). As explained above, if the selected cell is in the high threshold state, then the first read/write bias might not successfully cause transition to the low threshold state. Thus, if the verify step (815) indicates that the selected cell stores the "1" value, then a first pulse in bias arrangement like that of FIG. 6B is applied for transition from the high to low threshold states (816). Following the first, the second pulse 603b is applied, which can be the same as the first read/write bias arrangement (817), and the write ends (818). If the verify step (815) indicates that the selected cell stores the "0" value, then write is ended (818).

If at step 811, it is determined that the data value to be written is "1," then the second write bias arrangement is applied, such as a pulse 602 of FIG. 6A, to induce a high threshold state along with suitable inhibit voltages applied to unselected cells that prevent disturbance of their data (812). Then the write process is ended (818).

The steps of the process illustrated in FIG. 8A-8B can be executed in parallel or in a different order as suits a particular implementation. Also, different combinations of program, read and verify sequences may be applied as suits a particular implementation.

Figure 9:
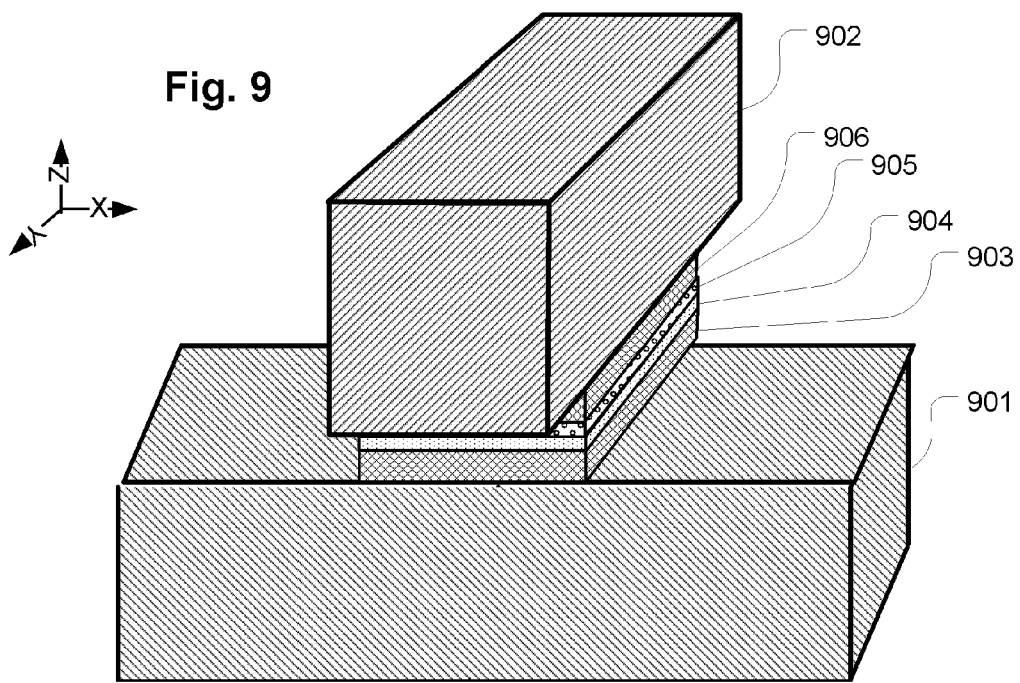
FIG. 9 is a perspective view illustration of an isolation device free memory cell formed at a crosspoint between first and second access lines.

FIG. 9 is a perspective view of a single memory cell such as that described above, in a crosspoint array. The crosspoint array is characterized by a first access line 901, such as a word line, and a second access line 902, such as a bit line, which overlies and is typically orthogonal to the first access line 901. A memory cell is formed at the crosspoint, which includes a four layer structure as illustrated in FIG. 1. The layers include a conductive pad terminal 903, a layer 904 of anti-fuse material, a layer 905 of phase change material, and a conductive pad terminal 906. The layer 904 of anti-fuse material and the layer 905 of phase change material are implemented with configurations and thicknesses that are optimized for operation of the memory cell. The conductive pad terminals 903, 906 can be omitted in some embodiments, or utilized as structural conductive spacers, for passively coupling the memory cells to the access lines and/or protection layers during manufacturing.

Figure 10:
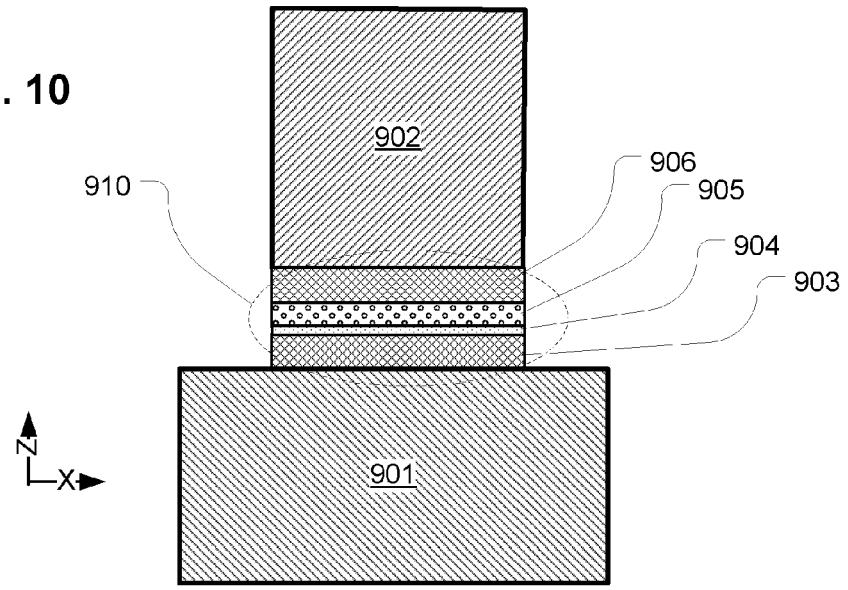
FIG. 10 is a cross-section taking in the X-Z plane of the device of FIG. 9.

FIG. 10 is a cross-section view in the X-Z plane of the structure of FIG. 9. As discussed above, the memory cell 910 includes the four layer structure comprising a conductive pad terminal 903, a layer 904 of anti-fuse material, a layer 905 of phase change material, and a conductive pad terminal 906.

Figure 11:
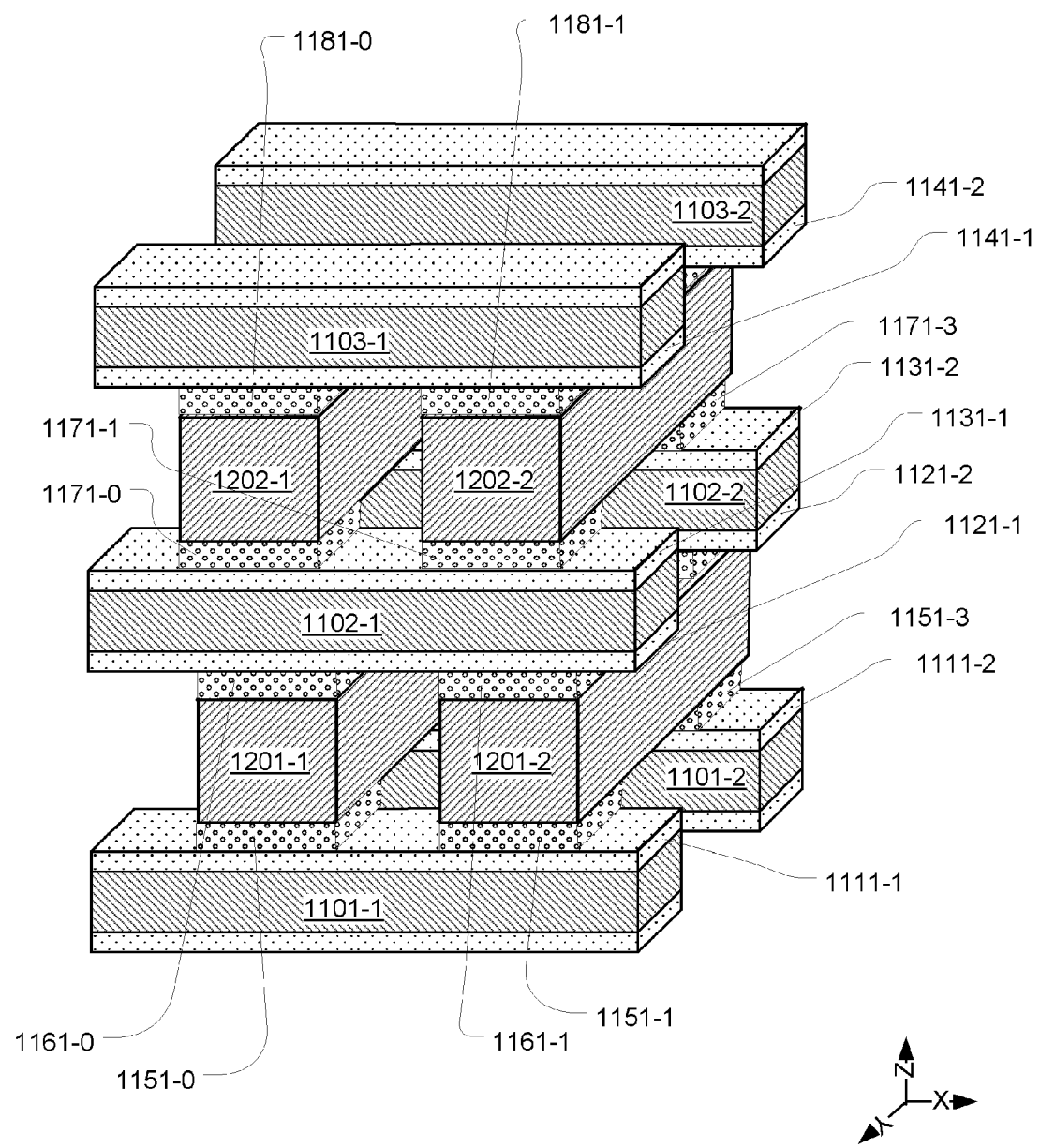
FIG. 11 is a perspective view illustration of one example of a 3D memory structure including isolation device free memory cells.

FIG. 11 is a perspective view of a block of cells from an array of isolation device free, phase change memory cells in a three-dimensional configuration. The three-dimensional array includes a plurality of word lines that includes word lines 1101-1 and 1101-2 in a first level, word lines 1102-1 and 1102-2 in a second level, and word lines 1103-1 and 1103-2 in a third level. Also, the three-dimensional array includes a plurality of bit lines, that includes bit lines 1201-1 and 1201-2 between the first and second levels of word lines, and bit lines 1202-1 and 1202-2 between the second and third levels of word lines. The bit lines and word lines can be implemented using single layer conductors or multiple layer conductors. In the illustrated implementation, the word lines 1101-1 and 1101-2, word lines 1102-1 and 1102-2, and word lines 1103-1 and 1103-2 each have a layer of anti-fuse material (1111-1, 1111-2, 1121-1, 1121-2, 1131-1, 1131-2, 1141-1 1141-2) formed on upper and lower surfaces thereof. Pads of phase change material are implemented at the cross points so that the structure results in four levels of memory cells, including representative memory cells 1151-0, 1151-1 and 1151-3 in level I, representative memory cells 1161-0, 1161-1 and 1161-3 in level II, representative memory cells 1171-0, 1171-1 and 1171-3 in level III and representative memory cells 1181-0 and 1181-1 in level IV. The overall array implemented in the configuration of FIG. 11 can have many layers, and many bit lines and word lines in each layer for formation of very high density memory devices. Other 3D configurations can be implemented, including a three dimensional array in which, like the structure of FIG. 11, the plurality of word lines and the plurality of bit lines are arranged for access to multiple levels of memory cells.

Figure 12:
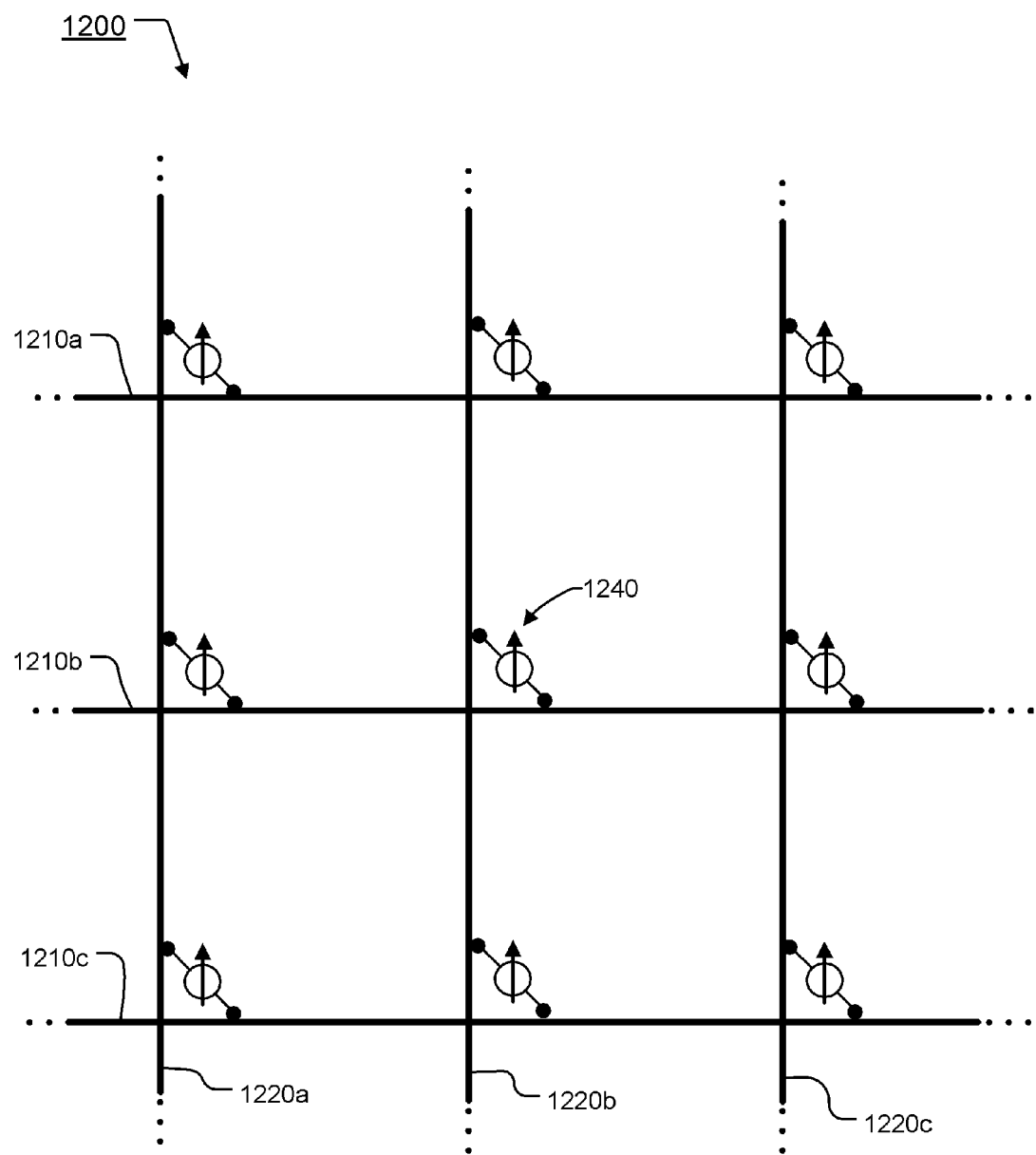
FIG. 12 illustrates a schematic diagram of a portion of a crosspoint memory array implemented using isolation device free memory cells as described herein.

FIG. 12 illustrates a schematic diagram of a portion of a crosspoint memory array implemented using isolation device free memory cells as described herein. As shown in FIG. 12, each of the memory cells of the array 1200 is an isolation device free memory device, represented by a resistive memory element along a current path between a corresponding word line 1210a-1210c and a corresponding bit line 1220a-1220c.

The array comprises a plurality of word lines 1210a, 1210b, and 1210c extending in parallel in a first direction, and a plurality of bit lines 1220a, 1220b, and 1220c extending in parallel in a second direction perpendicular to the first direction. The array 1200 is referred to as a crosspoint array because the word lines 1210a-1210c and bit lines 1220a-1220c cross each other but do not physically intersect, and the memory cells are located at these crosspoints.

Memory cell 1240 is representative of the memory cells of array 1200 and is arranged at the crosspoint location of the word line 1210b and the bit line 1220b. The memory cell 1240 is passively coupled to the word line 1210b and passively coupled to the bit line 1220b.

Reading or writing the memory cell 1240 of array 1200 can be achieved by applying appropriate voltage pulses to the corresponding word line 1210b and bit line 1220b to induce a current through the selected memory cell 1240, while applying appropriate inhibit voltages to the unselected word lines and bit lines. The level and duration of the voltages applied is dependent upon the operation performed, e.g. a reading operation or a programming operation.

In one example, during the read and first and second reset bias arrangements, a full voltage V of the corresponding pulse, is applied to the selected word line (e.g. word line 1210b), while one half voltage V/2 of the corresponding pulse is applied to the unselected word lines (e.g. word lines 1210a and 1210c). Also, a zero voltage is applied to the selected bit line (e.g. 1220b), while a half voltage V/2 of the corresponding pulse is applied to the unselected bit lines (e.g. bit lines 1220a and 1220c). This results in the selected cell 1240 receiving the full pulse height V, while the unselected cells are biased at V/2.

In another example, during the read and first and second reset bias arrangements, a full voltage V of the corresponding pulse, is applied to the selected word line (e.g. word line 1210b), while one third voltage V/3 of the corresponding pulse is applied to the unselected word lines (e.g. word lines 1210a and 1210c). Also, a zero voltage is applied to the selected bit line (e.g. 1220b), while a two thirds voltage 2V/3 of the corresponding pulse is applied to the unselected bit lines (e.g. bit lines 1220a and 1220c). This results in the selected cell 1240 receiving the full pulse height V, while the unselected cells that do not lie on the selected word line or selected bit line receive a bias of +V/3, while the unselected cells that share either the selected word line or the selected bit line receive a bias of −V/3.

Similar bias arrangements can be applied to the 3D configurations of the memory device.

Figure 13:
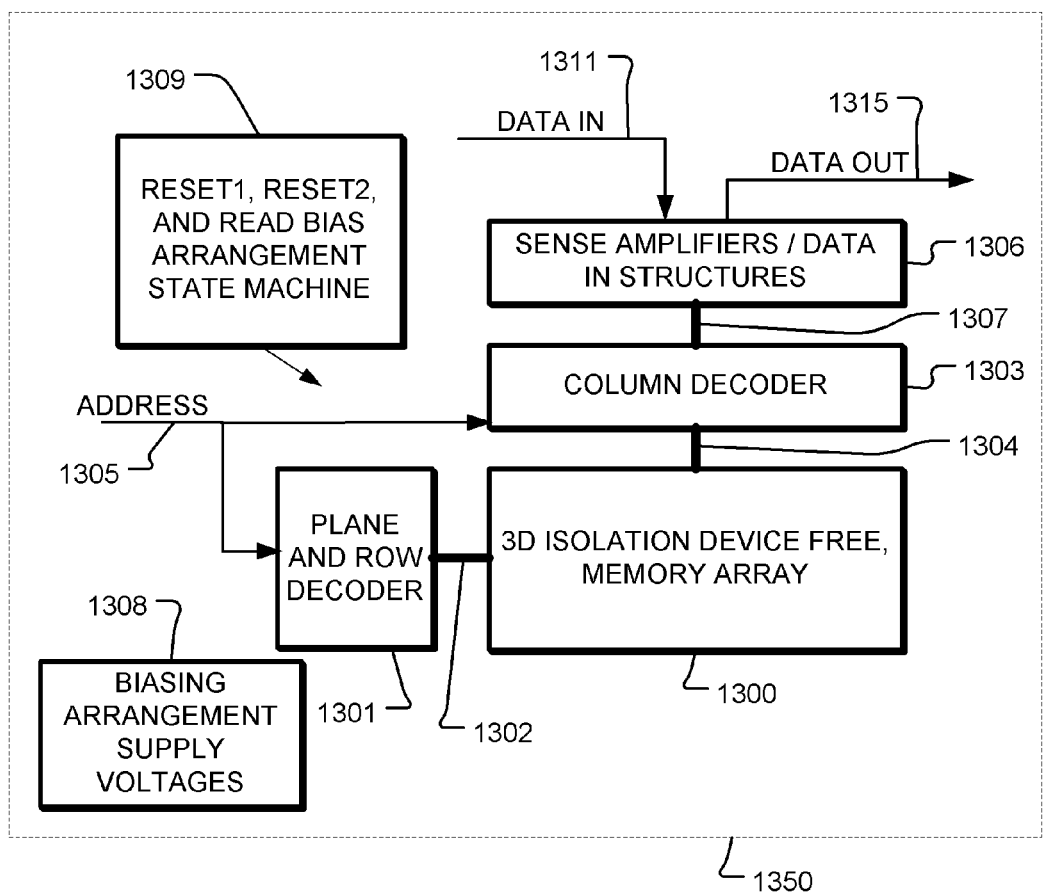
FIG. 13 is a block diagram of an integrated circuit with an isolation device free memory array.

FIG. 13 shows an integrated circuit 1350 including a 3D isolation device free memory array 1300. A row and plane decoder 1301 is coupled to, and in electrical communication with, a plurality 1302 of word lines, and arranged along rows in the memory array 1300. A column decoder 1303 is coupled to and in electrical communication with a plurality of bit lines 1304 arranged along columns in the memory array 1300 for reading data from, and writing data to, the memory cells in the 3D memory array 1300. Addresses are supplied on bus 1305 to the plane and row decoder 1301 and to the column decoder 1303. Sense amplifiers, and other supporting circuitry such as pre-charge circuits and so on, along with data-in structures in block 1306, are coupled to the column decoder 1303 via the bus 1307. Data is supplied via the data-in line 1311 from input/output ports on the integrated circuit 1350 or other data sources, to the data-in structures in block 1306. Data is supplied via the data-out line 1315 from the sense amplifiers in block 1306 to input/output ports on the integrated circuit 1350, or to other data destinations internal or external to the integrated circuit 1350. A bias arrangement state machine is in circuitry 1309, controlling biasing arrangement supply voltages 1308, the sense circuitry and the data-in structures, for read and write operations. The circuitry can be implemented using special purpose logic, a general purpose processor or a combination thereof, configured to execute the operating modes described herein, including for example the process of FIGS. 8A and 8B, using bias arrangements like those described with reference to FIGS. 6, 7 and 12.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a plurality of bit lines and a plurality of word lines; and
an array of memory cells passively coupled to the plurality of bit lines and the plurality of word lines, the memory cells in the array respectively including an anti-fuse element and an element of phase change material in series, the phase change material having a lower resistivity phase and higher resistivity phase;
sense circuitry coupled to the array of memory cells, to sense whether a selected memory cell has a threshold below a read threshold;
control circuitry coupled to the plurality of bit lines and the plurality of word lines to apply bias arrangements for operation of the memory cells, including:
a first write bias arrangement to induce the higher resistivity phase in an active region of the element of phase change material of a selected memory cell establishing a first threshold for the selected memory cell below the read threshold,
a second write bias arrangement to induce the higher resistivity phase in the active region of the element of phase change material of a selected memory cell establishing a second threshold for the selected memory cell above the read threshold; and
a read bias arrangement to apply the read threshold to a selected memory cell.

2. The integrated circuit of claim 1, wherein the read bias arrangement includes a voltage pulse having a pulse shape arranged to reestablish the first threshold in the selected memory cell.

3. The integrated circuit of claim 1, wherein the bias arrangements applied by the control circuitry include an initialize bias arrangement to rupture the anti-fuse elements in the array of memory cells.

4. The integrated circuit of claim 1, wherein the anti-fuse elements in the array of memory cells include rupture filaments in contact with the element of phase change material.

5. The integrated circuit of claim 1, wherein the read bias arrangement and the first write bias arrangement are identical.

6. The integrated circuit of claim 1, wherein the element of phase change material is in contact with the anti-fuse element.

7. The integrated circuit of claim 1, wherein the array of memory cells comprises a three dimensional array, and the plurality of word lines and the plurality of bit lines are arranged for access to multiple levels of memory cells in the three dimensional array.

8. An integrated circuit memory device, comprising:
a first access conductor and a second access conductor;
a memory cell between the first access conductor and second access conductor, the memory cell including:
a layer of anti-fuse material having first and second surfaces, the first surface being proximal to or in contact with the first access conductor,
a layer of phase change material having first and second surfaces, the first surface of the layer of phase change material in contact with the second surface of the layer of anti-fuse material, the second surface of the layer of phase change material passively coupled to the second access conductor; and
an electrode comprising a rupture filament through the layer of anti-fuse material passively coupled to said first access conductor and contacting the layer of phase change material;

sense circuitry coupled to the memory cell, to sense whether the memory cell has a threshold below a read threshold; and control circuitry coupled to the first and second access conductors to apply bias arrangements for operation of the memory cell, including:

a first write bias arrangement to induce the higher resistivity phase in an active region of the element of phase change material establishing a first threshold for the memory cell below the read threshold;

a second write bias arrangement to induce the higher resistivity phase in the active region of the element of phase change material establishing a second threshold for the memory cell above the read threshold; and a read bias arrangement to apply the read threshold to the memory cell.

9. The integrated circuit of claim 8, wherein the read bias arrangement includes a voltage pulse having a pulse shape arranged to reestablish the first threshold in the selected memory cell.

10. The integrated circuit of claim 9, wherein the bias arrangements applied by the control circuitry include an initialize bias arrangement to form the rupture filament.

11. The integrated circuit of claim 10, wherein the read bias arrangement and the first write bias arrangement are identical.

12. A method of operating a memory cell including an anti-fuse element and an element of phase change material in series, the phase change material having a lower resistivity phase and higher resistivity phase, comprising:

initializing the memory cell by rupturing the anti-fuse element;

writing a first data value in the memory cell by applying a first write bias arrangement to induce a first volume of the higher resistivity phase in an active region of the element of phase change material establishing a first threshold for the selected memory cell below a read threshold;

writing a second data value in the memory cell by applying a second write bias arrangement to induce a second volume of the higher resistivity phase in the active region of the element of phase change material establishing a second threshold for the selected memory cell above the read threshold; and reading data in the memory cell by sensing whether the selected memory cell has a threshold below the read threshold.

13. The method of claim 12, wherein the memory cell is on an integrated circuit, and said initializing is executed using control circuitry on the integrated circuit.

14. The method of claim 12, wherein said reading includes applying a read voltage pulse having a pulse shape arranged to reestablish the first threshold in the memory cell.

15. The method of claim 14, wherein the first write bias arrangement includes applying a write voltage pulse identical to the read voltage pulse.

* * * * *